United States Patent
Ni et al.

(10) Patent No.: US 6,777,347 B1
(45) Date of Patent: Aug. 17, 2004

(54) METHOD TO PRODUCE POROUS OXIDE INCLUDING FORMING A PRECOATING OXIDE AND A THERMAL OXIDE

(75) Inventors: Chyi-Tsong Ni, Hsin-Chu (TW); Eric Su, Kaohsiung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/765,044

(22) Filed: Jan. 19, 2001

(51) Int. Cl.$^7$ .................. H01L 21/31; H01L 21/469
(52) U.S. Cl. ............ 438/771; 438/787; 438/788; 438/790
(58) Field of Search .................. 438/771, 788, 438/790, 787

(56) References Cited

U.S. PATENT DOCUMENTS

| | | | |
|---|---|---|---|
| 5,635,102 A | 6/1997 | Mehta | 428/428 |
| 5,824,375 A | 10/1998 | Gupta | 427/569 |
| 5,840,631 A | 11/1998 | Kubo et al. | 438/789 |
| 5,904,566 A * | 5/1999 | Tao et al. | 438/689 |
| 6,054,206 A | 4/2000 | Mountsier | 428/312.8 |
| 6,054,735 A * | 4/2000 | Ngo | 257/693 |
| 6,099,647 A | 8/2000 | Yieh et al. | 118/697 |
| 6,114,216 A | 9/2000 | Yieh et al. | 438/424 |
| 6,149,987 A * | 11/2000 | Perng et al. | 427/255.37 |
| 6,194,304 B1 * | 2/2001 | Morozumi et al. | 438/618 |
| 6,348,415 B1 * | 2/2002 | Lee et al. | 438/622 |

* cited by examiner

*Primary Examiner*—William M. Brewster
(74) *Attorney, Agent, or Firm*—George O. Saile; Stephen B. Ackerman; Stephen G. Stanton

(57) ABSTRACT

A method for forming porous silicon oxide film, comprising the following steps. A CVD chamber having inner walls and a wafer chuck/heater is provided. At least a portion of the CVD chamber inner walls is pre-coated with a layer of first PECVD silicon oxide film having a first thermal CVD oxide deposition rate thereupon. A semiconductor wafer is placed on the wafer chuck/heater within pre-coated CVD chamber. The semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls. A porous silicon oxide film is deposited upon the upper second PECVD silicon oxide film overlying the semiconductor wafer. The porous silicon oxide film being different from the first PECVD silicon oxide film coating the CVD chamber inner walls.

34 Claims, 1 Drawing Sheet

METHOD TO PRODUCE POROUS OXIDE INCLUDING FORMING A PRECOATING OXIDE AND A THERMAL OXIDE

FIELD OF THE INVENTION

The present invention relates generally to semiconductor fabrication processes and more specifically to processes of fabricating porous silicon oxide for low dielectric constant films utilized in semiconductor fabrication.

BACKGROUND OF THE INVENTION

Current methods to form low density, porous silicon oxide for low dielectric constant films are relatively complex whereby an organic group containing a silica precursor is deposited in a chemical vapor deposition (CVD) reactor. Afterwards, the organic group is removed by heating in an oxidizing gas environment to create a porous oxide.

The disadvantages of such a process include the need for multiple process steps, and the relatively high process cost. Furthermore, heating in a furnace to remove the organic group has the potential risks of device shift and metal line deformation due to the high furnace temperature process.

For example, U.S. Pat. No. 6,054,206 to Mountsier describes a CVD process for producing low-density, porous oxides in a vacuum environment. An organic-group-containing silica precursor is deposited on a semiconductor substrate in a CVD reactor. The organic groups are then removed by heating in a furnace in an oxidizing environment or by exposure to an oxidizing plasma, thereby creating a low density silica film.

U.S. Pat. No. 5,824,375 to Gupta describes a chamber coating (seasoning) process before a CVD oxide deposition. A plasma clean process is used to remove sorbable contaminants such as fluorine. The chamber is then seasoned to block or retard remaining contaminants.

U.S. Pat. No. 5,635,102 to Mehta describes a thermal oxide deposition process and etch methods.

U.S. Pat. No. 5,840,631 to Kubo et al. describes a CVD silicon oxide formation method directly on a surface of a semiconductor substrate. A compound gas having a catalysis for promoting formation of silicon oxide is added in an atmosphere using a main component gas consisting of ozone, water vapor, and one of alkoxysilane and organosiloxane as a source gas to form a silicon oxide.

U.S. Pat. Nos. 6,114,216 and 6,099,647, both to Yich et al., describe system, method, and apparatus for high temperature (at least about 500 to 800° C.) processing of semiconductor wafers.

SUMMARY OF THE INVENTION

Accordingly, it is an object of the present invention to provide a method to form a porous, low density silicon oxide film within a single process chamber.

Another object of the present invention is to provide a method to form a porous, low density oxide film using a relatively low temperature process to avoid any impact on semiconductor device performance.

Yet another object of the present invention is to provide a method to form a porous, low density oxide film having a formation temperature compatible with back-end multilevel metal interconnection without causing metal deformation and/or melting.

Other objects will appear hereinafter.

It has now been discovered that the above and other objects of the present invention may be accomplished in the following manner. Specifically, a CVD chamber having inner walls and a wafer chuck/heater is provided. At least a portion of the CVD chamber inner walls is pre-coated with a layer of first PECVD silicon oxide film having a first thermal CVD oxide deposition rate thereupon. A semiconductor wafer is placed on the wafer chuck/heater within pre-coated CVD chamber. The semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls. A porous silicon oxide film is deposited upon the upper second PECVD silicon oxide film overlying the semiconductor wafer. The porous silicon film being different from the first PECVD silicon oxide film coating the CVD chamber inner walls.

DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Pre-coating CVD Chamber

Figure 1:
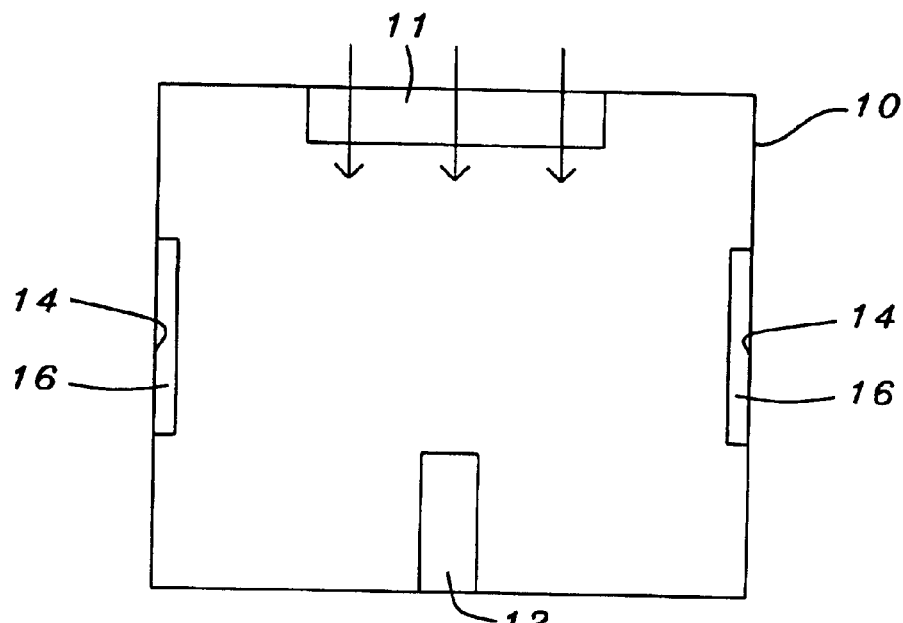
FIGS. 1 and 2 illustrate the preferred embodiment of the present invention.

FIG. 1 illustrates a simplified schematic drawing of chemical vapor deposition (CVD) chamber 10 having shower head 11, inner walls 14 and wafer chuck 12. CVD chamber 10 is pre-coated with a thin layer of plasma enhanced (PE) CVD oxide film 16 that is different than the main porous silicon oxide film 20 to be formed over wafer 18. A PECVD process requires the application of plasma power to form a plasma within CVD chamber 10 to form PECVD oxide film 16 upon at least a portion of CVD chamber inner walls 14. Generally, the deposition rate on chamber inner walls 14 must be different that the deposition of wafer 18 in order for a porous film to be formed upon wafer 18. PECVD oxide film 16 preferably pre-coats at least 50% of CVD chamber inner walls 14; more preferably pre-coats from about 50 to 100% of CVD chamber inner walls 14; and most preferably pre-coats from about 75 to 100% of CVD chamber inner walls 14.

For example, PE CVD oxide film 16 is preferably comprised of PE TEOS and is more preferably PE TEOS deposited with TEOS (or others, generally silicon-containing organics) and oxygen gas at the following parameters:

plasma power—preferably from about 300 to 1200 W, and more preferably from about 800 to 1000;

TEOS flow rate—preferably from about 200 to 2000 sccm, and more preferably from about 800 to 1500 sccm;

oxygen flow rate—preferably from about 200 to 2000 sccm, and more preferably from about 800 to 1500 sccm;

temperature—preferably from about 300 to 500° C.; more preferably from about 360 to 440° C.; and for preferably from about 3 to 80 seconds, and more preferably from about 10 to 30 second;

to form a PE CVD oxide film 16 having a thickness of preferably from about 100 to 8000 Å, and more preferably from about 300 to 3000 Å.

PE oxide film 16 has a thickness of preferably from about 100 to 8000 Å, more preferably from about 300 to 3000 Å, and most preferably from about 500 to 1500 Å.

Formation of Porous Silicon Oxide Film

Figure 2:
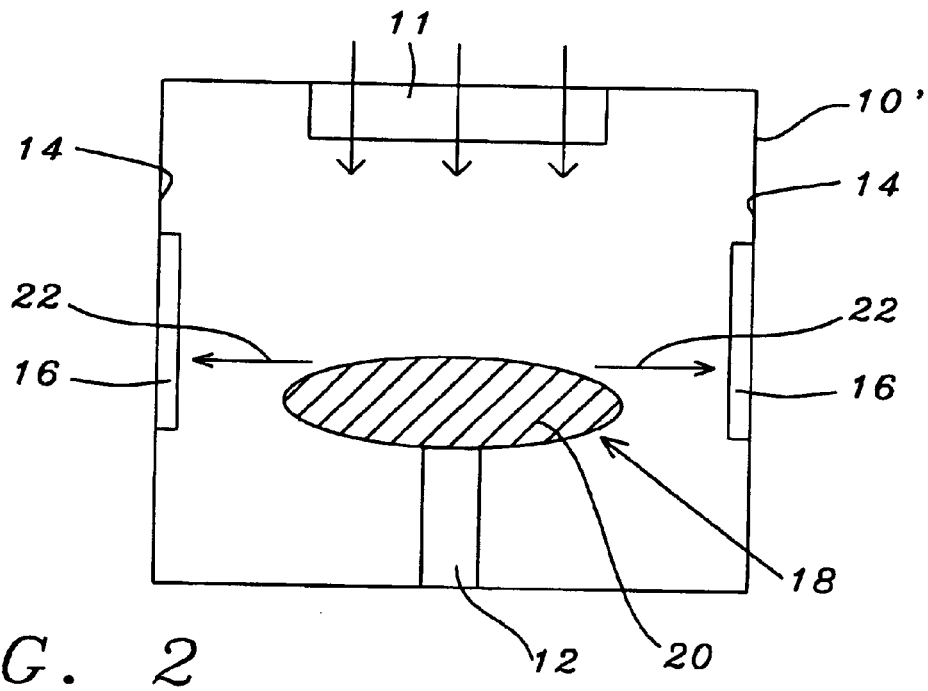

As shown in FIG. 2, wafer 18 is then transferred into PECVD oxide film 16 pre-coated CVD chamber 10' and is mounted on wafer chuck/heater 12. Wafer 18 is pre-heated to a temperature of preferably from about 250 to 500° C., and more preferably from about 350 to 420° C. before the in flow of the thermal CVD oxide film 20 silica precursors.

Figure 3:
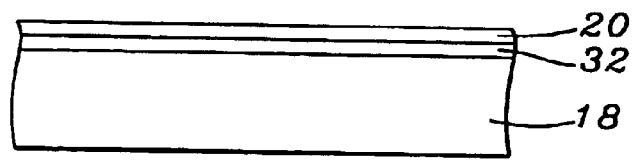
FIG. 3 is a schematic, cross-sectional enlargement of the porous oxide film coated wafer.

As shown in FIG. 3, wafer 18 may have an optional upper intermetal dielectric (IMD) layer, for example, comprised of PECVD silane ($SiH_4$) oxide film 32. PECVD silane ($SiH_4$) oxide film 32 has a thickness of preferably from about 100 to 2000 Å, and more preferably from about 300 to 1200 Å.

As shown in FIGS. 2 and 3, main porous silicon oxide film 20 is then formed over wafer 18 by a thermal CVD process. Thermal CVD means that no plasma power is used, and thermal decomposition is used to form porous oxide film 20 upon wafer 18. Porous silicon oxide film 20 has a thickness of preferably from about 500 to 10,000 Å, and more preferably from about 500 to 8000 Å.

Silica precursor gasses are introduced into CVD chamber 10 through a shower head (not shown) with down flow to wafer 18. Silica precursor gasses may comprise of, for example, organic groups. An oxidant is also introduced in to CVD chamber 10 and reacts with the silica precursor gasses to form main porous oxide film 20 upon wafer 18. The thermal CVD process temperature is preferably from about 300 to 500° C.

The silica precursor gasses, such as TEOS with an oxidizer, such as ozone ($O_3$), are thermally decomposed within pre-coated CVD chamber 10' by a thermal CVD process to form porous oxide film 20 upon wafer 18 having high porosity and relatively low density at the following parameters:

temperature—preferably from about 300 to 500° C.; more preferably from about 350 to 450° C.;

TEOS flow rate—preferably from about 100 to 600 sccm; more preferably from about 150 to 350 sccm;

ozone flow rate—preferably from about 1000 to 7000 sccm; more preferably from about 4000 to 6000 sccm;

time—preferably from about 20 to 400 seconds; more preferably from about 50 to 350 seconds;

ozone concentration—preferably from about 2 to 14%; more preferably from about 3 to 6%; and He flow—preferably from about 2000 to 6000 sccm; more preferably from about 3000 to 4500 sccm.

Porosity of Porous Silicon Oxide Film

Porous oxide film 20 formed by the method of the present invention has: a density of preferably from about 2.0 to 2.9 $g/cm^3$, and more preferably from about 2.2 to 2.4 $g/cm^3$.

Proposed Mechanism of Formation of Porous Silicon Oxide Film

The proposed mechanism of forming porous oxide film 20 is attributed to different thermal CVD deposition rates between thermal CVD depositing upon wafer 18 and pre-coated CVD chamber inner walls 14. The inventors have determined that the thermal CVD oxide deposition rate is dependent upon the substrate (either wafer 18 or pre-coated CVD chamber inner walls 14) if at least a portion of CVD chamber inner walls 14 are pre-coated with PE TEOS oxide film 16.

Specifically, the inventors have determined that the deposition of thermal CVD TEOS oxide on: (1) wafers 18 having an upper PE $SiH_4$ oxide film 32 is about 25 Å/second; and (2) wafers having an upper PE TEOS oxide film is about 29 Å/second. Thus, the inventors posit that there exists a competition in thermal CVD oxide deposition between PE $SiH_4$ oxide film 32 coated wafer 18 and PE TEOS oxide film 16 pre-coated CVD chamber inner walls 14 (See FIGS. 2 and 3).

Generally, there exists a competition in thermal CVD oxide deposition between a wafer surface with an upper PE oxide film having a first thermal CVD deposition rate, and a pre-coated PE oxide thin film inner wall of a CVD chamber, for example, having a second thermal CVD deposition rate that is greater than the first thermal CVD deposition rate. In the case of CVD chamber inner walls 14 that have been pre-coated with a thin film 16 with a relatively high thermal CVD deposition rate, the thermal CVD reactant gases will be attracted, as at 22 of FIG. 2, towards pre-coated inner walls 14 more than towards the surface of wafer 18 having upper film 32.

Consequently, the oxide formation mechanism on the surface of wafer 18 will be distributed, or relatively irregular, so that the structure of such oxide films 20 so formed becomes porous due to the attracting force 22 towards pre-coated chamber inner walls 14. For example, a plasma enhanced (PE) oxide film may be used to coat at least a portion of CVD chamber inner walls 14 while the main porous film 20 is a thermally deposited oxide film.

The precursor gas may be attracted towards the chamber inner walls 14 during the deposition process. The attractive forces towards the chamber inner walls 14 disturb a relatively dense film formation at the kink sites. Surface diffusion is an essential part of oxide film growth. Atoms must move to the energetically favorable sites, i.e. the kink sites, at the ledge (step) of a crystalline plane for crystalline film growth. Kink sites are energetically favorable sites for reactant adsorbed species to form oxide.

Preferably less than about 10, and more preferably from about 1 to 4, thermal CVD porous oxide film 20 formation runs may be performed for each PECVD oxide film 16 pre-coating of CVD chamber 10. Pre-coated CVD chamber 10' must be etched after each such series of runs before the next PECVD oxide film 16 pre-coating of CVD chamber 10.

Advantages of the Present Invention

The advantages of the porous silicon oxide fabrication method of the present invention include:

1) porous, low-density silicon oxide films may be formed within a single process chamber;
2) porous, low-density silicon oxide films may be formed using a relatively low temperature process to avoid any impact on semiconductor device performance, that is the temperature is lower than the metal melting point of any metal semiconductor devices;
3) porous, low-density silicon oxide films may be formed using a formation temperature compatible with back-end multilevel metal interconnection without causing metal deformation and/or melting; and
4) porous, low-density silicon oxide films may be formed without the need for an oxidation process.

While particular embodiments of the present invention have been illustrated and described, it is not intended to limit the invention, except as defined by the following claims.

We claim:

1. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls; and depositing a porous silicon oxide film upon the upper second PECVD silicon oxide film overlying the semiconductor wafer; the porous silicon oxide film being different from the first PECVD silicon oxide film coating the CVD chamber inner walls.

2. The method of claim 1, including the step of pre-heating the semiconductor wafer before depositing the porous silicon oxide film.

3. The method of claim 1, wherein the first PECVD silicon oxide film coating the CVD chamber inner walls has a thickness of from about 100 to 8000 Å; the upper second PECVD silicon oxide film overlying the semiconductor wafer has a thickness of from about 100 to 2000 Å; and the porous silicon oxide film has a thickness of preferably from about 500 to 10,000 Å.

4. The method of claim 1, wherein the deposition of porous silicon oxide film is conducted at: a temperature from about 300 to 500° C.; a TEOS flow rate from about 100 to 600 sccm; an ozone flow rate from about 1000 to 7000 sccm; and a time from about 20 to 400 seconds.

5. The method of claim 1, wherein the deposition of porous silicon oxide film is conducted at: a temperature from about 350 to 450° C.; a TEOS flow rate from about 150 to 350 sccm; an ozone flow rate from about 4000 to 6000 sccm; and a time from about 50 to 350 seconds.

6. The method of claim 1, wherein the deposited porous silicon oxide film has a density of from about 2.0 to 2.9 g/cm$^3$.

7. The method of claim 1, wherein the deposited porous silicon oxide film has a density of from about 2.2 to 2.4 g/cm$^3$.

8. The method of claim 1, wherein the first PECVD silicon oxide film pre-coating the CVD chamber inner walls is comprised of PE TEOS oxide; and the upper second PECVD silicon oxide film over the semiconductor wafer is comprised of PE SiH$_4$ oxide.

9. The method of claim 1, including the step of pre-heating the semiconductor wafer to from about 250 to 500° C. before depositing the porous silicon oxide film.

10. The method of claim 1, including the step of pre-heating the semiconductor wafer to from about 350 to 420° C. before depositing the porous silicon oxide film.

11. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls;

pre-heating the semiconductor wafer; and depositing a porous silicon oxide film upon the upper second PECVD silicon oxide film overlying the semiconductor wafer by a thermal CVD process; the porous silicon oxide film being different from the first PECVD silicon oxide film coating the CVD chamber inner walls.

12. The method of claim 11, wherein the first PECVD silicon oxide film coating the CVD chamber inner walls has a thickness of from about 100 to 8000 Å; the upper second PECVD silicon oxide film overlying the semiconductor wafer has a thickness of from about 100 to 2000 Å; and the porous silicon oxide film has a thickness of from about 500 to 10,000 Å.

13. The method of claim 11, wherein the thermal CVD deposition of porous silicon oxide film is conducted at: a temperature from about 300 to 500° C.; a TEOS flow rate from about 100 to 600 sccm; an ozone flow rate from about 1000 to 7000 sccm; and a time from about 20 to 400 seconds.

14. The method of claim 11, wherein the thermal CVD deposition of porous silicon oxide film is conducted at: a temperature from about 350 to 450° C.; a TEOS flow rate from about 150 to 350 sccm; an ozone flow rate from about 4000 to 6000 sccm; and a time from about 50 to 350 seconds.

15. The method of claim 11, wherein the thermal CVD deposited porous silicon oxide film has a density of from about 2.0 to 2.9 g/cm$^3$.

16. The method of claim 11, wherein the thermal CVD deposited porous silicon oxide film has a density of from about 2.2 to 2.4 g/cm$^3$.

17. The method of claim 11, wherein the first PECVD silicon oxide film pre-coating the CVD chamber inner walls is comprised of PE TEOS oxide; and the upper second PECVD silicon oxide film over the semiconductor wafer is comprised of PE SiH$_4$ oxide.

18. The method of claim 11, wherein the semiconductor wafer is pre-heated to from about 250 to 500° C.

19. The method of claim 11, wherein the semiconductor wafer is pre-heated from about 350 to 420° C.

20. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls;

pre-heating the semiconductor wafer; and depositing a porous silicon oxide film upon the upper second PECVD silicon oxide film overlying the semiconductor wafer by a thermal CVD process temperature of from about 300 to 500° C.; the porous silicon oxide film being different from the first PECVD silicon oxide film coating the CVD chamber inner walls.

21. The method of claim 20, wherein the first PECVD silicon oxide film coating the CVD chamber inner walls has a thickness of from about 100 to 8000 Å; the upper second PECVD silicon oxide film overlying the semiconductor wafer has a thickness of from about 100 to 2000 Å; and the porous silicon oxide film has a thickness of from about 500 to 10,000 Å.

22. The method of claim 20, wherein the thermal CVD deposition of porous silicon oxide film is further conducted at: a TEOS flow rate from about 100 to 600 sccm; an ozone flow rate from about 1000 to 7000 sccm; and a time from about 20 to 400 seconds.

23. The method of claim 20, wherein the thermal CVD deposition of porous silicon oxide film is conducted at: a temperature from about 350 to 450° C.; a TEOS flow rate from about 150 to 350 sccm; an ozone flow rate from about 4000 to 6000 sccm; and a time from about 50 to 350 seconds.

24. The method of claim 20, wherein the thermal CVD deposited porous silicon oxide film has a density of from about 2.0 to 2.9 g/cm$^3$.

25. The method of claim 20, wherein the thermal CVD deposited porous silicon oxide film has a density of from about 2.2 to 2.4 g/cm$^3$.

26. The method of claim 20, wherein the first PECVD silicon oxide film pre-coating the CVD chamber inner walls is comprised of PE TEOS oxide; and the upper second PECVD silicon oxide film over the semiconductor wafer is comprised of PE SiH$_4$ oxide.

27. The method of claim 20, wherein the semiconductor wafer is pre-heated to from about 250 to 500° C.

28. The method of claim 20, wherein the semiconductor wafer is pre-heated from about 350 to 420° C.

29. The method of claim 1, wherein the porous silicon oxide film is thermally deposited without plasma power.

30. The method of claim 11, wherein the porous silicon oxide film is thermally deposited without plasma power.

31. The method of claim 20, wherein the porous silicon oxide film is thermally deposited without plasma power.

32. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls; and depositing a porous silicon oxide film upon the upper second PECVD silicon oxide film overlying the semiconductor wafer; the porous silicon oxide film being different from the first PECVD silicon oxide film coating the CVD chamber inner walls; whereby the porous silicon oxide film deposits faster upon the first PECVD silicon oxide film than on the upper second PECVD silicon oxide film.

33. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD oxide deposition rate thereupon that is less than the first thermal CVD oxide deposition rate upon the first PECVD silicon oxide film coating the CVD chamber inner walls;

pre-heating the semiconductor wafer; and depositing a porous silicon oxide film upon the upper second PECVD silicon oxide film overlying the semiconductor wafer by a thermal CVD process; the porous silicon oxide film being different from the first PECVD silicon oxide film coating the CVD chamber inner walls; whereby the porous silicon oxide film deposits faster upon the first PECVD silicon oxide film than on the upper second PECVD silicon oxide film.

34. A method for forming porous silicon oxide film, comprising the steps of:

providing a CVD chamber having inner walls and a wafer chuck/heater;

pre-coating at least a portion of the CVD chamber inner walls with a layer of first PECVD silicon oxide film having a first thermal CVD oxide deposition rate thereupon;

placing a semiconductor wafer on the wafer chuck/heater within pre-coated CVD chamber; the semiconductor wafer including an upper second PECVD silicon oxide film having a second thermal CVD) oxide deposition rate thereupon that is less than the first thermal CVD oxide deposition rate upon the first PECVD silicon oxide film coating the CVD chamber inner walls;

pre-heating the semiconductor wafer; and depositing a porous silicon oxide film upon the upper second PECVD silicon oxide film overlying the semiconductor wafer by a thermal CVD process temperature of from about 300 to 500° C.; the porous silicon oxide film being different from the first PECVD silicon oxide film coating the CVD chamber inner walls; whereby the porous silicon oxide film deposits faster upon the first PECVD silicon oxide film than on the upper second PECVD silicon oxide film.

* * * * *